United States Patent
Wheeler et al.

(10) Patent No.: US 6,708,321 B2
(45) Date of Patent: Mar. 16, 2004

(54) GENERATING A FUNCTION WITHIN A LOGIC DESIGN USING A DIALOG BOX

(75) Inventors: William R. Wheeler, Southborough, MA (US); Mathew J. Adiletta, Worcester, MA (US); Timothy J. Fennell, Holliston, MA (US)

(73) Assignee: Intel Corporation, Santa Clara, CA (US)

( * ) Notice: Subject to any disclaimer, the term of this patent is extended or adjusted under 35 U.S.C. 154(b) by 192 days.

(21) Appl. No.: 10/038,706

(22) Filed: Jan. 4, 2002

(65) Prior Publication Data

US 2003/0051223 A1 Mar. 13, 2003

Related U.S. Application Data

(60) Provisional application No. 60/315,852, filed on Aug. 29, 2001.

(51) Int. Cl.[7] ............................................... G06F 17/50
(52) U.S. Cl. ............................................. 716/18; 716/3
(58) Field of Search ............... 716/1–18; 717/106–109; 345/520, 522

(56) References Cited

U.S. PATENT DOCUMENTS

| | | |
|---|---|---|
| 5,128,871 A | 7/1992 | Schmitz |
| 5,220,512 A | 6/1993 | Watkins et al. |
| 5,258,919 A | 11/1993 | Yamanouchi et al. |
| 5,506,788 A | 4/1996 | Cheng et al. |
| 5,513,119 A | 4/1996 | Moore et al. |
| 5,553,002 A | 9/1996 | Dangelo et al. |
| 5,629,857 A | 5/1997 | Brennan |
| 5,666,289 A | 9/1997 | Watkins |
| 5,828,581 A | 10/1998 | Matumura |
| 5,852,564 A | 12/1998 | King et al. |
| 5,889,677 A | 3/1999 | Yasuda et al. |
| 5,892,678 A | 4/1999 | Tokunoh et al. |
| 5,933,356 A | 8/1999 | Rostoker et al. |
| 5,963,724 A | 10/1999 | Mantooth et al. |
| 5,974,242 A | * 10/1999 | Damarla et al. ............... 716/2 |
| 6,044,211 A | 3/2000 | Jain |
| 6,053,947 A | 4/2000 | Parson |
| 6,066,179 A | 5/2000 | Allan |
| 6,106,568 A | 8/2000 | Beausang et al. |
| 6,117,183 A | 9/2000 | Teranishi et al. |
| 6,120,549 A | 9/2000 | Goslin et al. |

(List continued on next page.)

OTHER PUBLICATIONS

Foley et al., "An Object Based Graphical User Interface for Power Systems", IEEE Transactions on Power Systems, vol. 8, No. 1, Feb. 1993, pp. 97–104.

Pedram et al., "Floorplanning with Pin assignment", 1990 IEEE International Conference on Computer–Aided Design, Nov. 11, 1990, pp. 98–101.

Mentor Graphics Corporation, Renoir™ With HDL2Graphics™, pp. 1–6, 1998, Oregon.

Mentor Graphics Corporation, Renoir HDL Design Datasheet, pp. 1–2, 1999, Oregon.

Computer Design, "After Hard Knocks, Cycle–Based Simulators Stand Their Ground". http://www.computer-design.com/Editorial/1996/10/ASIC/after.html, accessed on Aug. 23, 2001, pp. 1–5.

Renoir, HDL Design Datasheet, Mentor Graphics, pp. 1–8, 1999.

*Primary Examiner*—Vuthe Siek
(74) *Attorney, Agent, or Firm*—Fish & Richardson P.C.

(57) ABSTRACT

A method of generating a function within a logic design of a circuit, includes representing the function using an operator. The function has n operands, where n>1. The method also includes presenting the function within a schematic representation of the logic design. Other features may include displaying a dialog box and inputting data that corresponds to the function.

27 Claims, 3 Drawing Sheets

U.S. PATENT DOCUMENTS

| | | | |
|---|---|---|---|
| 6,132,109 A | 10/2000 | Gregory et al. | |
| 6,135,647 A | 10/2000 | Balakrishnan et al. | |
| 6,152,612 A | 11/2000 | Liao et al. | |
| 6,205,573 B1 | 3/2001 | Hasegawa | |
| 6,219,822 B1 | 4/2001 | Gristede et al. | |
| 6,233,540 B1 | 5/2001 | Schaumont et al. | |
| 6,233,723 B1 | 5/2001 | Pribetich | |
| 6,234,658 B1 * | 5/2001 | Houldsworth | 716/4 |
| 6,236,956 B1 | 5/2001 | Mantooth et al. | |
| 6,260,179 B1 | 7/2001 | Ohsawa et al. | |
| 6,272,671 B1 | 8/2001 | Fakhry | |
| 6,298,468 B1 | 10/2001 | Zhen | |
| 6,311,309 B1 | 10/2001 | Southgate | |
| 6,324,678 B1 * | 11/2001 | Dangelo et al. | 716/18 |
| 6,366,874 B1 | 4/2002 | Lee et al. | |
| 6,378,115 B1 | 4/2002 | Sakurai | |
| 6,401,230 B1 | 6/2002 | Ahanessians et al. | |
| 6,449,762 B1 | 9/2002 | McElvain | |
| 6,457,164 B1 | 9/2002 | Hwang et al. | |
| 6,477,683 B1 | 11/2002 | Killian et al. | |
| 6,477,689 B1 | 11/2002 | Mandell et al. | |
| 6,480,985 B1 | 11/2002 | Reynolds et al. | |
| 6,487,698 B1 | 11/2002 | Andreev et al. | |
| 6,505,341 B1 | 1/2003 | Harris et al. | |
| 6,519,742 B1 * | 2/2003 | Falk | 716/3 |
| 6,519,755 B1 | 2/2003 | Anderson | |
| 2001/0018758 A1 | 8/2001 | Tanaka et al. | |
| 2002/0023256 A1 | 2/2002 | Seawright | |
| 2002/0042904 A1 | 4/2002 | Ito et al. | |
| 2002/0046386 A1 | 4/2002 | Skoll et al. | |
| 2002/0049957 A1 | 4/2002 | Hosono et al. | |
| 2002/0166100 A1 | 11/2002 | Meding | |
| 2003/0005396 A1 | 1/2003 | Chen et al. | |
| 2003/0016206 A1 | 1/2003 | Taitel | |
| 2003/0016246 A1 | 1/2003 | Singh | |

* cited by examiner

GENERATING A FUNCTION WITHIN A LOGIC DESIGN USING A DIALOG BOX

CROSS-REFERENCE TO RELATED APPLICATIONS

This application claims priority from U.S. Provisional Application No. 60/315,852, filed Aug. 29, 2001, and titled "Visual Modeling and Design Capture Environment," which is incorporated by reference.

TECHNICAL FIELD

This invention relates to circuit simulation.

BACKGROUND

Logic designs for circuits typically include either schematic design or text design. A schematic design shows a circuit design with logic elements as a two-dimensional diagram. Logic elements are either state elements (e.g., flip-flops, latches, etc.) or combinatorial elements (e.g., AND gates, NOR gates, etc.). State elements provide storage from one cycle of operation to the next cycle of operation. Combinatorial elements are used to perform operations on two or more signals.

A textual representation describes the logic elements of a circuit using one-dimensional text lines. Textual representations are used in hardware description languages (HDLs) which allow designers to simulate logic designs prior to forming the logic on silicon. Examples of such languages include Verilog and Very High-Level Design Language (VHDL). Using these languages, a designer can write code to simulate a logic design and execute the code in order to determine if the logic design performs properly.

Standard computer languages may also be used to simulate a logic design. One example of a standard computer language that may be used is C++.

DESCRIPTION

Figure 1:
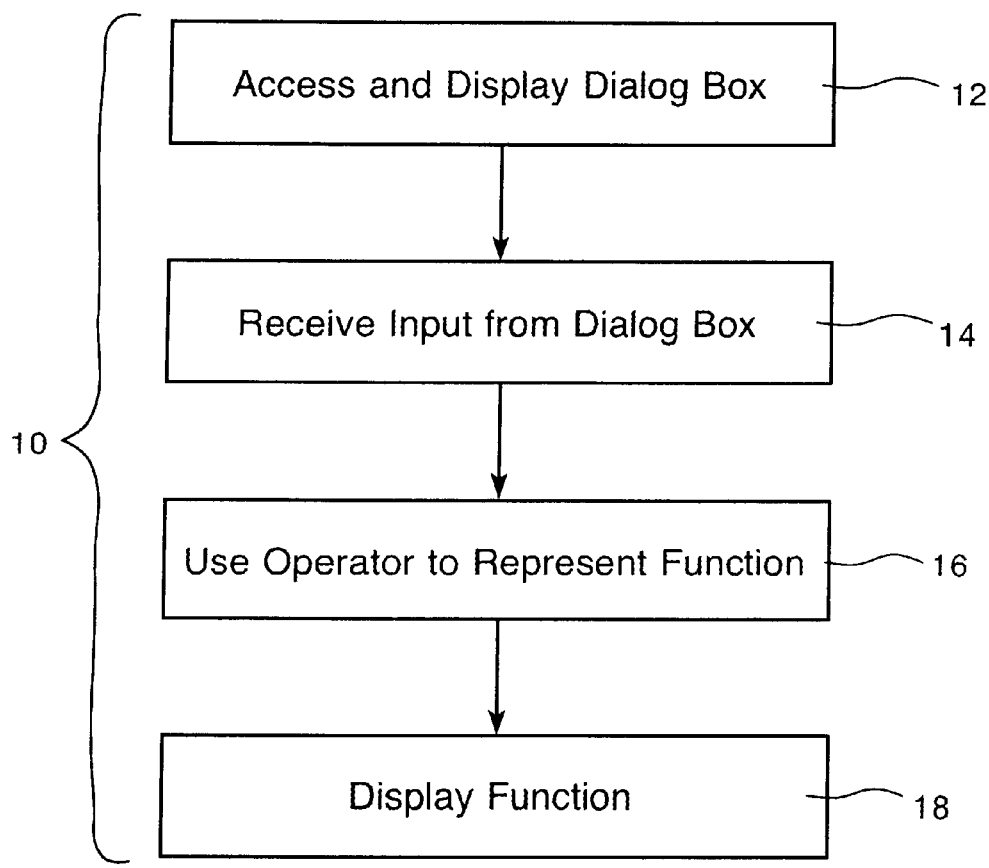
FIG. 1 is a flowchart showing a process for generating a logic design using programmable binary operators.

Referring to FIG. 1, a process 10 is used in generating a logic design to generate a configurable binary operator gate by using programmable binary operators. The configurable binary operator gate is a generalized gate structure designed to model a user-defined function comprised of a binary operator acting on two operands. Thus, the gate structure can be designed to be an adder, a shifter, a comparator, an incrementor, etc.

Process 10 may be implemented using a computer program running on a computer 50 (FIG. 4) or other type of machine, as described in more detail below. As explained below, by using binary operators, complex logic models can be presented to a user (not shown) that have a simple readable body element comprised of the gate structure and a software code representing the gate structure displayed within the gate structure.

Figure 2:
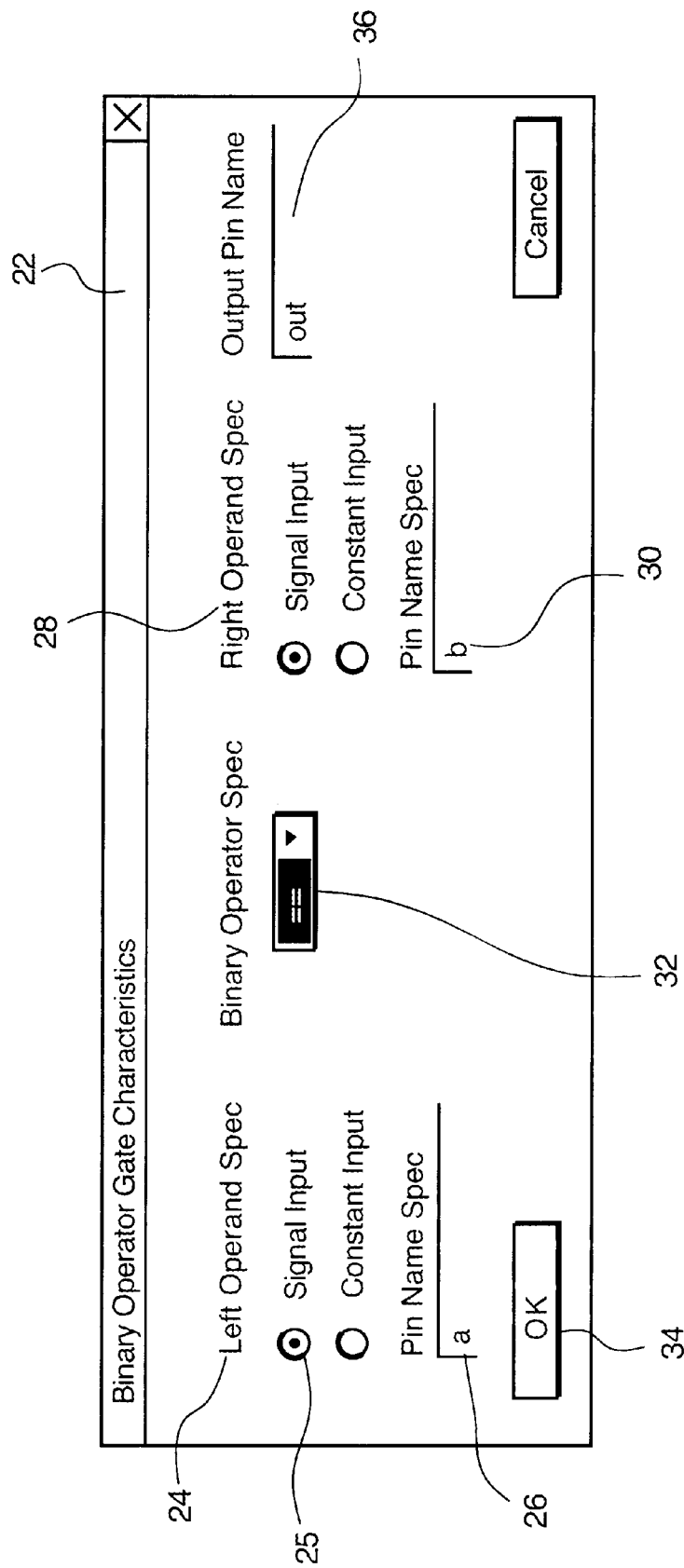
FIG. 2 is a screenshot of a dialog box for generating a logic design having a binary operator.

Referring to FIG. 2, process 10 accesses and displays (12) a dialog box 22 in response to a user input. The user may use any input/output (I/O) device to access and display (12) dialog box 22. For example, design tools employing process 10 may reside on a personal computer and the tools may operate in a MS-Windows® environment. If the user determines that a function having a binary operator is needed in the design, the user pulls-down a menu (not shown) or right-clicks a mouse button to access dialog box 22. In response, process 10 displays dialog box 22 is displayed on a computer monitor.

Process 10 receives input (14) from dialog box 22. In this regard, dialog box 22 may be a graphical user interface (GUI) into which the user inputs data to generate a gate structure (see, e.g., FIG. 3 described below). For example, using a mouse, the user may choose either a signal input or a constant input for a left operand 24 and for a right operand 28 by clicking on a circle 25 next to the desired choice. If a constant is chosen, dialog box 22 is highlighted indicating to the user a constant has been chosen. Using a keyboard, the user types-in a left pin name 26, a right pin name 30, and an output pin name 36. The user further accesses a pull-down menu 32 to choose a desired binary operator. By clicking on "OK" button 34, the user has provided the inputs from dialog box 22 to process 10.

Process 10 uses the binary operator selected from pull-down menu 32 to represent (16) the corresponding function. For example, if the binary operator chosen is "==", a gate 40 (FIG. 3) representing a comparator function is displayed. Binary operator symbols can be a logical operator or a non-logical operator. The binary operator symbol "==" is a logical operator. Logical operators produce an output of either a '1' or a '0' or a bit width of 1. For non-logical operators (e.g., "+", ">>", etc.), the bit width of the output is equal to the bit width of each input. For example, if the function, a+b, is chosen and an input signal a is 4 bits wide and input signal b is a 4 bits wide, then the resulting output signal is 4 bits wide.

Other functions can be represented by using the following binary operator symbols:

| Binary Operator Symbols | Function | Notation |
| --- | --- | --- |
| + | Addition | a + b = c |
| − | Subtraction | a − b = c |
| * | Multiplication | a × b = c |
| / | Division | a ÷ b = c |
| % | Modulo | a modulo b |
| && | Logical AND | a AND b |
| \|\| | Logical OR | a OR b |
| >> | Shift Right | Take a and shift right by b |
| << | Shift Left | Take a and shift left by b |
| < | Less than | Is a < b? |
| <= | Less than or equal | Is a ≦ b? |
| == | Equal | Is a = b? |
| != | Not equal | Is a ≠ b? |
| > | Greater than | Is a > b? |
| >= | Greater than or equal | Is a ≧ b? |
| === | Three state equal | Is a = b? |
| !== | Three state not equal | Is a ≠ b? |

Figure 3:
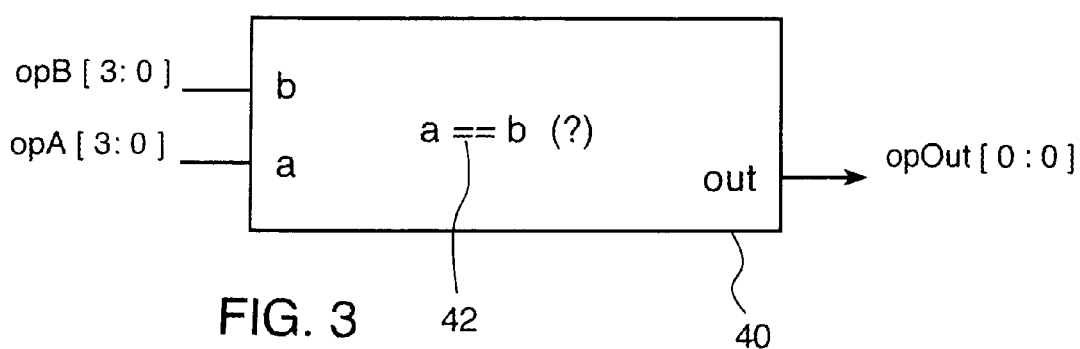
FIG. 3 is a schematic representation of a function generated from the dialog box in FIG. 2.

Referring to FIGS. 2 and 3, process 10 displays (18) the function selected as a gate 40 using a Verilog code 42. In other words, process 10 embeds a textual combinatorial data block into a two-dimensional schematic presentation. The information depicted in FIG. 2 is represented in FIG. 3, e.g., "a==b (?)" is the Verilog code for a comparator. In this example, input signal a is represented by "opA[3:0]" and input signal b is represented by "opB[3:0]." Also, input signal a and input signal b are each 4 bits wide. Process 10 automatically (i.e., without user intervention) generates an output signal "out" represented as "opOut[0:0]," as a one bit wide signal. Thus, process 10 reduces the need to have large libraries based on bit-width size by automatically calculating an appropriate bit-width size.

Figure 4:
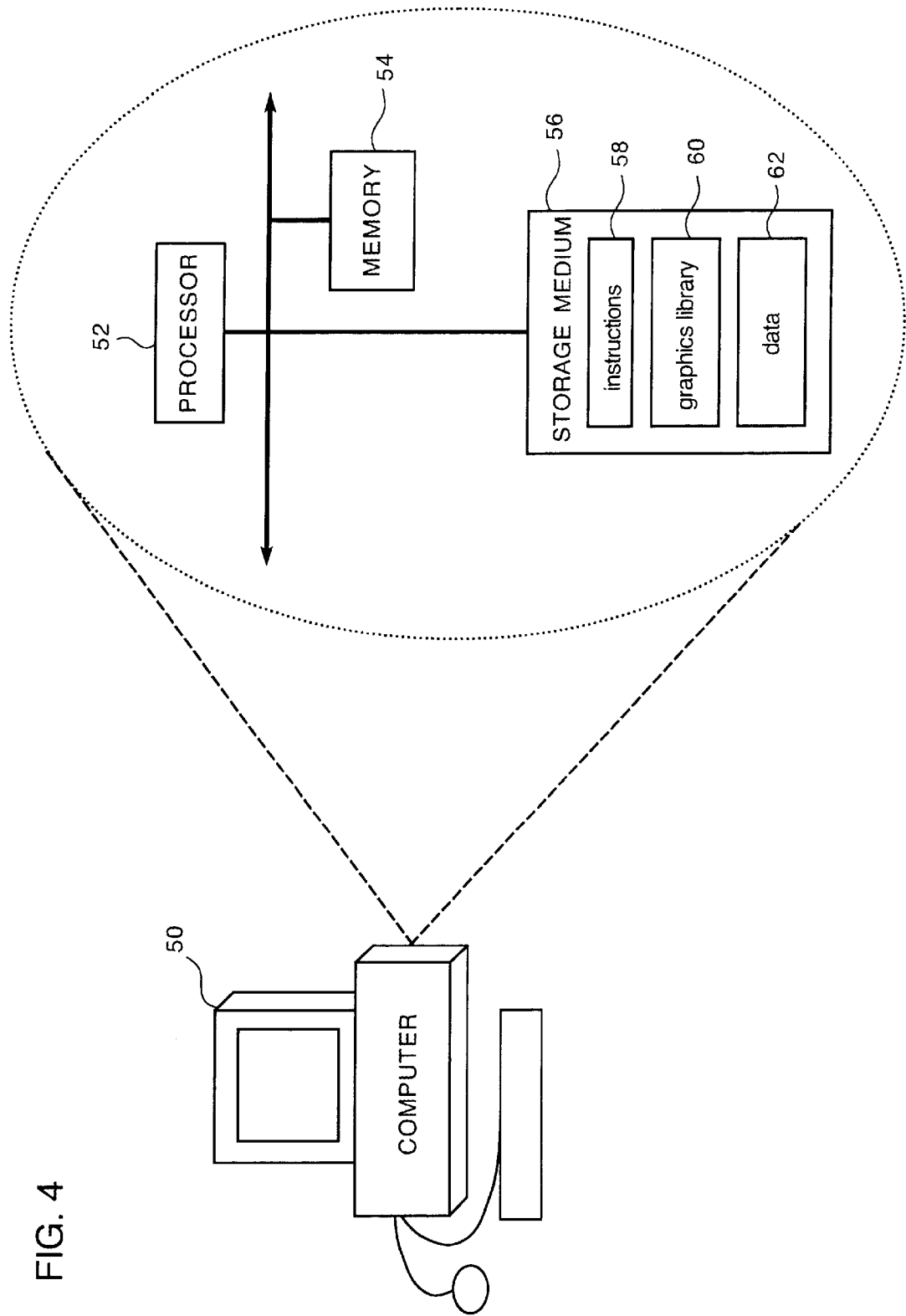
FIG. 4 is a block diagram of a computer system on which the process of FIG. 1 may be performed.

FIG. 4 shows computer 50 for generating a logic design using process 10. Computer 50 includes a processor 52, a memory 54, and a storage medium 56 (e.g., a hard disk). Storage medium 56 stores data 62 which defines a logic design, a graphics library 60 used in implementing the logic design, and machine-executable instructions 58, which are executed by processor 52 out of memory 54 to perform process 10 on data 62.

Process 10, however, is not limited to use with the hardware and software of FIG. 4; it may find applicability in any computing or processing environment. Process 10 may be implemented in hardware, software, or a combination of the two. Process 10 may be implemented in computer programs executing on programmable computers or other machines that each includes a processor, a storage medium readable by the processor (including volatile and non-volatile memory and/or storage elements), at least one input device, and one or more output devices. Program code may be applied to data entered using an input device, such as a mouse or a keyboard, to perform process 10 and to generate a simulation.

Each such program may be implemented in a high level procedural or object-oriented programming language to communicate with a computer system. However, the programs can be implemented in assembly or machine language. The language may be a compiled or an interpreted language.

Each computer program may be stored on an article of manufacture, such as a storage medium or device (e.g., CD-ROM, hard disk, or magnetic diskette), that is readable by a general or special purpose programmable machine for configuring and operating the machine when the storage medium or device is read by the machine to perform process 10. Process 10 may also be implemented as a machine-readable storage medium, configured with a computer program, where, upon execution, instructions in the computer program cause the machine to operate in accordance with process 10.

The invention is not limited to the specific embodiments set forth above. Process 10 is not limited to using two operands. Process 10 can be used with k operands, where k>1. Process 10 is not limited to binary operators but may be any x-state operators, where x≧2. Also, process 10 is not limited to embedding one-dimensional design into a two-dimensional design. Process can be any n-dimensional design embedded into a (n+m)-dimensional design, where n≧1 and m≧1. Process 10 is not limited to the computer languages set forth above, e.g., Verilog, C++, and VHDL. It may be implemented using any appropriate computer language. Process 10 is also not limited to the order set forth in FIG. 1. That is, the blocks of process 10 may be executed in a different order than that shown to produce an acceptable result.

Other embodiments not described herein are also within the scope of the following claims.

What is claimed is:

1. A method of generating a function within a logic design of a circuit, comprising:
   displaying a dialog box used to define the function;
   representing the function using an operator, the function having n operands, where n>1; and
   presenting the function within a schematic representation of the logic design.

2. The method of claim 1, wherein n=2.

3. The method of claim 2, wherein one of the two operands comprises a constant value.

4. The method of claim 2, wherein one of the two operands corresponds to a signal.

5. The method of claim 2, wherein the two operands correspond to signals.

6. The method of claim 1, wherein the operator comprises a binary operator.

7. The method of claim 6, wherein the binary operator comprises a logical operator.

8. The method of claim 1, further comprising inputting data that corresponds to the function.

9. The method of claim 1, further comprising highlighting the dialog box when one of the n operands is a constant.

10. An article comprising a machine-readable medium which stores executable instructions to generate a function within a logic design of a circuit, the instructions causing a machine to:
    display a dialog box used to define the function;
    represent the function using an operator, the function having n operands, where n>1; and
    present the function within a schematic representation of the logic design.

11. The article of claim 10, wherein n=2.

12. The article of claim 11, wherein one of the two operands comprises a constant value.

13. The article of claim 11, wherein one of the two operands corresponds to a signal.

14. The article of claim 11, wherein the two operands correspond to signals.

15. The article of claim 10, wherein the operator comprises a binary operator.

16. The article of claim 15, wherein the binary operator comprises a logical operator.

17. The article of claim 10, further comprising instructions causing the machine to input data that corresponds to the function.

18. The article of claim 10, further comprising instructions causing the machine to highlight the dialog box when one of the n operands is a constant.

19. An apparatus for generating a function within a logic design of a circuit, comprising:
    a memory that stores executable instructions; and
    a processor that executes the instructions to:
    display a dialog box used to define the function;
    represent the function using an operator, the function having n operands, where n>1; and
    present the function within a schematic representation of the logic design.

20. The apparatus of claim 19, wherein n=2.

21. The apparatus of claim 19, wherein one of the two operands comprises a constant value.

22. The apparatus of claim 21, wherein one of the two operands corresponds to a signal.

23. The apparatus of claim 20, wherein the two operands correspond to signals.

24. The apparatus of claim 19, wherein the operator comprises a binary operator.

25. The apparatus of claim 24, wherein the binary operator comprises a logical operator.

26. The apparatus of claim 19, wherein the processor executes instructions to input data that corresponds to the function.

27. The apparatus of claim 19, wherein the processor executes instructions to highlight the dialog box when one of the n operands is a constant.

* * * * *

UNITED STATES PATENT AND TRADEMARK OFFICE
CERTIFICATE OF CORRECTION

PATENT NO.    : 6,708,321 B2                                              Page 1 of 1
DATED         : March 16, 2004
INVENTOR(S)   : Matthew J. Adiletta, Timothy J. Fennell and William R. Wheeler It is certified that error appears in the above-identified patent and that said Letters Patent is hereby corrected as shown below:

<u>Title page,</u>
Item [75], Inventor, please replace "Mathew J. Adiletta" with
-- Matthew J. Adiletta --.

Signed and Sealed this

Thirteenth Day of July, 2004

JON W. DUDAS
*Acting Director of the United States Patent and Trademark Office*